US009572211B2

(12) United States Patent
Reiter et al.

(10) Patent No.: US 9,572,211 B2
(45) Date of Patent: Feb. 14, 2017

(54) METHOD AND SYSTEM FOR IMPROVING LED LIFETIME AND COLOR QUALITY IN DIMMING APPARATUS

(71) Applicant: Microchip Technology Incorporated, Chandler, AZ (US)

(72) Inventors: Andreas Reiter, Feldkirchen-Westerham (DE); Sean Stacy Steedman, Phoenix, AZ (US); Lucio Di Jasio, Munich (DE); Joseph Julicher, Maricopa, AZ (US); Yong Yuenyongsgool, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/714,427

(22) Filed: May 18, 2015

(65) Prior Publication Data

US 2015/0334796 A1 Nov. 19, 2015

Related U.S. Application Data

(60) Provisional application No. 62/000,139, filed on May 19, 2014.

(51) Int. Cl.
*H03F 3/45* (2006.01)
*H05B 33/08* (2006.01)

(52) U.S. Cl.
CPC ...... *H05B 33/0815* (2013.01); *H05B 33/0845* (2013.01); *H05B 33/0851* (2013.01)

(58) Field of Classification Search
USPC ................ 315/291, 297, 307, 308, 313, 362
See application file for complete search history.

(56) References Cited

U.S. PATENT DOCUMENTS

2008/0246516 A1* 10/2008 Hoang ................ H03D 13/004 327/12
2013/0082624 A1 4/2013 Brassfield et al. ............ 315/297

OTHER PUBLICATIONS

International Search Report and Written Opinion, Application No. PCT/US2015/031346, 10 pages, Jul. 21, 2015.

* cited by examiner

*Primary Examiner* — Douglas W Owens
*Assistant Examiner* — Jianzi Chen
(74) *Attorney, Agent, or Firm* — Slayden Grubert Beard PLLC

(57) ABSTRACT

In a pulse width modulation light emitting diode (LED) controller an error amplifier and output load switch are synchronously controlled to prevent service life shortening current overshoot through the LEDs and slowing discharging currents causing color temperature shifting in the light output from the LEDs. A plurality of switching arrangements for the error amplifier and the compensation network may be provided in a single integrated circuit LED dimming controller, and outputs for controlling a variety of differently configured output power switch combinations for disconnecting or shorting the LEDs, or disconnecting the output capacitor during off times of the modulated dimming control signal.

19 Claims, 9 Drawing Sheets

METHOD AND SYSTEM FOR IMPROVING LED LIFETIME AND COLOR QUALITY IN DIMMING APPARATUS

RELATED PATENT APPLICATION

This application claims priority to commonly owned U.S. Provisional Patent Application No. 62/000,139; filed May 19, 2014; which is hereby incorporated by reference herein for all purposes.

TECHNICAL FIELD

The present disclosure relates to light emitting diodes (LED), and, in particular, to a method and system for dimming apparatus that improves LED lifetime and color temperature consistency thereof.

BACKGROUND

LEDs used for area lighting, automotive exterior lighting, medical lighting and television backlighting require a way to dim the LEDs to obtain a desired lighting level and/or average lumen output. LED dimming may be provided with analog linear dimming or pulse width modulation (PWM) dimming. Linear dimming of LEDs is used to reduce/adjust brightness thereof by changing current through the LEDs. Change in current through the LEDs results in a shift of the chromaticity coordinates (change of color temperature). Many applications like retrofit light bulb replacement, automotive lighting, medical lighting or professional illumination systems highly rely on specific color temperatures to meet application specific light requirements or legal regulations. PWM dimming turns on and off (allows current to flow and not flow through the LEDs) at a nominal current necessary to meet specific chromaticity coordinates during the on-time of the LEDs. The on and off frequency for dimming the LEDs has to be high enough to create a seemingly static (constant) light to the human eye.

PWM dimming of constant current sources causes three issues with LEDs: The first issue is high current overshoot as the LED is switched into the circuit (when the current source is turned back on after the dimming off-time). This overshoot shortens the service life of the LED. This effect can particularly be observed in lighting systems where switched-mode DC/DC converters are used as the current source. Control stages of analog switched-mode power converters utilize operational amplifiers as an inverting error amplifier. During the dimming off-time, the feedback signal drops to zero. The analog error amplifier thereupon increases its output voltage (reference voltage to peak current comparators or comparators in PWM generators) to compensate for the instantaneous error. The feedback loop of these amplifiers is closed by a circuit of resistors and capacitors (the compensation filter RC network). This RC network is either connected between the amplifier input and its output (circuit for general purpose operational amplifiers) or between the amplifier output and the circuit ground (circuit for trans-conductance operational amplifiers). When the amplifier output voltage increases to compensate for the instantaneous error during the PWM dimming off-time, the RC network is charged. When the feedback drops to zero, the error is maximal and so the output voltage of the error amplifier will increase up to the saturation point of the circuit. When the PWM dimming signal is turned back on, the error amplifier of the control circuit will force the switched-mode power converter to apply the maximum duty ratio of the switching frequency resulting in a short maximum power output, which will last until the feedback signal has tuned into normal levels of operation and the compensation network has de-saturated. To compensate for this issue, analog circuits are usually added to the error amplifier circuit to apply a fast soft-start ramp. These fast soft-start ramps, however, add a reduced average forward current component to the total LED forward current, causing a shift of chromaticity coordinates (shift in color temperature).

The second issue is a slow forward voltage decay after the current source is switched off that is caused by the discharging output capacitors of the disabled current source. This decay affects the color temperature, which becomes more and more dominant with shorter duty ratios.

The third issue is the physical limitation of minimum dimming PWM duty ratios when systems suffer from slow current slew rates of leading and/or falling edges. The time required to increase the LED forward current up to the nominal level and/or back down to zero limits the minimum on-time required to achieve a certain lumen output. When stable color temperatures are explicit, a minimum period of nominal forward current is required, further increasing the minimum on-time. This becomes an issue in applications when very low on-times and stable color temperatures are mandatory, like automotive exterior lighting, display backlights, medical or restoration lighting applications, and the like.

SUMMARY

Therefore a need exists for PWM dimming of LED lighting without varying a desired color temperature or shortening the service life time of the LEDs due to high current surges therethrough.

According to an embodiment, a circuit arrangement for controlling a light emitting diode (LED) device may comprise: a modulator operable to receive a pulse width modulation signal and a high frequency signal, and to generate a modulated high frequency signal; and a feedback circuit that may comprise an error amplifier and a compensation network, wherein the feedback circuit may be synchronously switched from a first configuration to a second configuration during off times of the modulated high frequency signal.

According to a further embodiment, an external load switch may be coupled in series with the LED device and open during the off times of the modulated high frequency signal. According to a further embodiment, the external load switch may be coupled to an anode of the LED device. According to a further embodiment, the external load switch may be coupled to a cathode of the LED device. According to a further embodiment, an external load switch may be coupled in parallel with the LED device that may be closed during the off times of the modulated high frequency signal. According to a further embodiment, an external load switch may be coupled in series with an output capacitor, wherein the external load switch may disconnect the output capacitor from the LED device during the off times of the modulated high frequency signal.

According to a further embodiment, the high frequency signal may be from about 100 kilohertz to several megahertz. According to a further embodiment, the pulse width modulation signal may be from about 100 hertz to about four (4) kilohertz.

According to a further embodiment, the first configuration may comprise the error amplifier and compensation network coupled together, and the second configuration may comprise an output of the error amplifier shorted to a common.

According to a further embodiment, wherein the first configuration may comprise the error amplifier and compensation network coupled together, and the second configuration may comprise an inverting input and output of the error amplifier shorted together. According to a further embodiment, the first configuration may comprise the error amplifier and compensation network coupled together, and the second configuration may comprise the compensation network decoupled from an output of the error amplifier, and inputs of the error amplifier decoupled from the compensation network and a voltage reference.

According to a further embodiment, the first configuration may comprise the error amplifier and compensation network coupled together, and the second configuration may comprise inverting and non-inverting inputs of the error amplifier shorted together. According to a further embodiment, the first configuration may comprise the error amplifier and compensation network coupled together, and the second configuration may comprise the compensation network decoupled from an output of the error amplifier.

According to another embodiment, a method of controlling a light emitting diode (LED) device may comprise the steps of: modulating a continuous high frequency signal with a lower frequency dimming signal having an on-off duty ratio to generate a control signal used in providing a desired lumen output from an LED device; and synchronously switching a feedback circuit, that may comprise an error amplifier and a compensation network, from a first configuration to a second configuration during off times of the modulated high frequency signal.

According to a further embodiment of the method, the step of disconnecting the LED device may be done with a series connected load switch during the off times of the modulated high frequency signal. According to a further embodiment of the method, the step of shorting the LED device may be done with a parallel connected load switch during the off times of the modulated high frequency signal. According to a further embodiment of the method, the step of disconnecting an output capacitor from the LED device may be done during the off times of the modulated high frequency signal.

According to yet another embodiment, an integrated circuit (IC) light emitting diode (LED) controller having light dimming capabilities may comprise: a first generator for providing a high frequency signal; a second generator for providing a pulse width modulation signal; a modulator operable to receive the pulse width modulation signal and the high frequency signal, and to generate a modulated high frequency signal; a feedback circuit comprising an error amplifier and a compensation network, wherein the feedback circuit may be synchronously switched from a first configuration to a second configuration during off times of the modulated high frequency signal; a LED driver for coupling the modulated high frequency signal to an LED device. According to a further embodiment, the IC LED controller may comprise a microcontroller.

BRIEF DESCRIPTION OF THE DRAWINGS

A more complete understanding of the present disclosure may be acquired by referring to the following description taken in conjunction with the accompanying drawings wherein.

Figure 1:
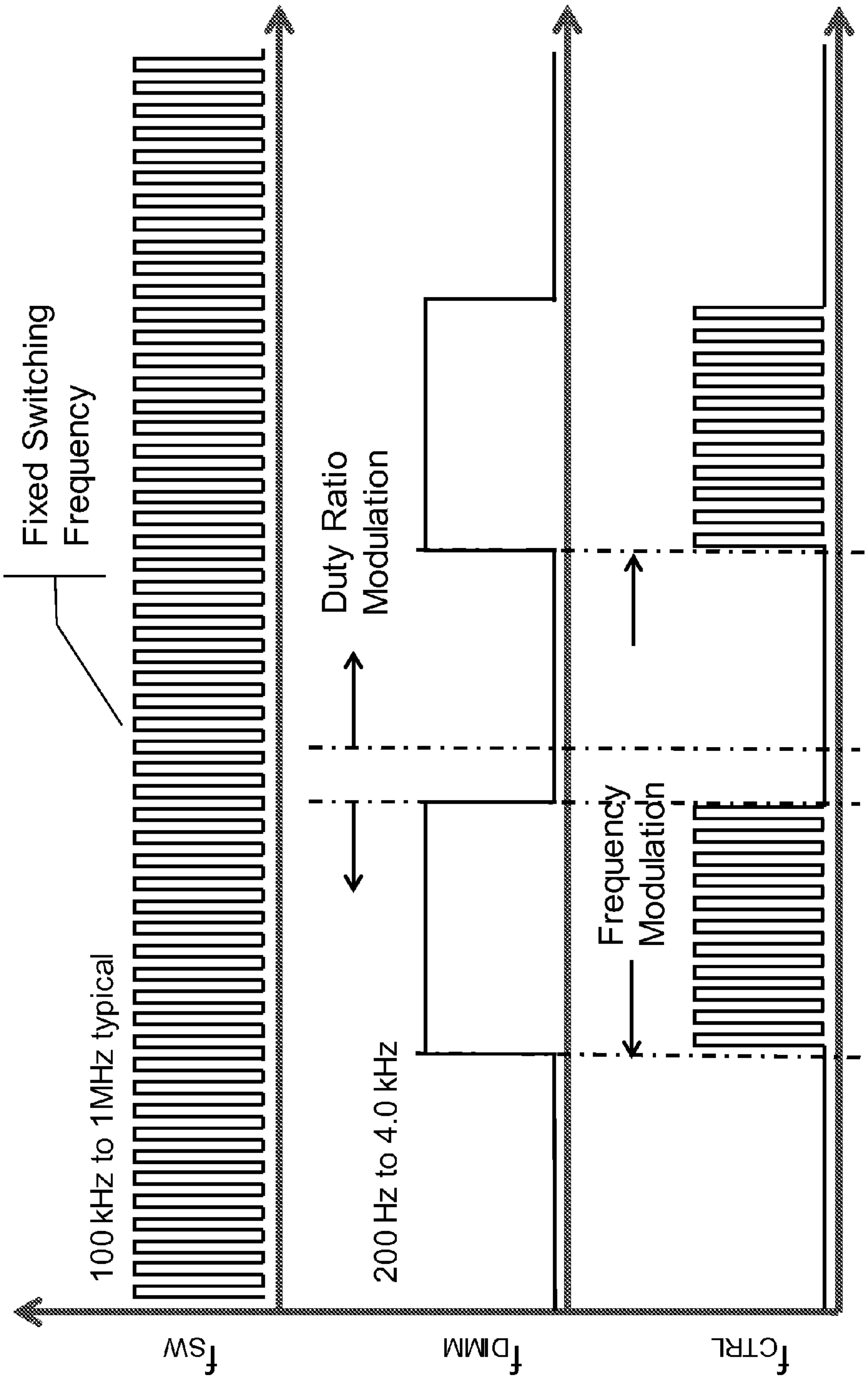
FIG. 1 illustrates a timing diagram of a typical enhanced LED PWM dimming waveform showing the combination of a pulse width modulation signal with a high frequency switching signal resulting in a modulated high frequency dimming signal.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, general purpose op-amp based compensation networks with increased features may be used to address all topologies, power levels and load-switch configurations currently used in the market with respect to LED PWM dimming.

According to various embodiments of this disclosure, methods may be provided to eliminate overshoot and slowly discharging currents during the dimming on and off times in order to increase the LED's life time and chromaticity coordinate (color temperature) while lowering overall power dissipation. Optimizing the rise and fall times of current waveforms also optimize the dimming ratios for newly emerging applications, e.g., automotive exterior front-lighting, display back-lighting, etc., where high dimming resolutions up to and above 3000:1 and/or short dimming ratios of 1% or less are required.

According to various embodiments of this disclosure, by synchronously manipulating the error amplifier and external load switch during off-time, overshoot and slowly discharging currents may be eliminated and the average forward current control precision may be optimized.

Most PWM dimmed LED driver modules currently available on the market are purely analog. Implementing and configuring desired dimming features in them require a certain level of integrated intelligence e.g., microcontroller unit (MCU). Although most LED driver modules also have a MCU on board, that may supply the dimming signal, there are no analog controllers available that allow advanced levels of error amplifier manipulation, according to the teachings of this disclosure, or the dimming controllers available only support a limited range of power supply topologies and power levels. Preventing the error amplifier from saturating while maintaining fast response is now possible according to various embodiments of this disclosure. A single integrated circuit LED dimming controller using PWM may be provided for use with all switched-mode power supply (SMPS) topologies and LED dimming requirements.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a timing diagram of a typical enhanced LED PWM dimming waveform showing the combination of a pulse width modulation signal with a high frequency switching signal resulting in a modulated high frequency dimming signal. A voltage waveform that is switched on and off at a switching frequency ($f_{SW}$) is rectified and filtered to a DC voltage that is supplied to at least one LED, e.g., a series connected string of LEDs (see FIG. 2). The switching frequency ($f_{SW}$) waveform is further modulated by a duty ratio waveform ($f_{DIMM}$) (pulse width modulation signal) that controls the brightness (averaged lumen output) of the LEDs with the resulting combination providing a dimming control voltage waveform ($f_{CTRL}$). This method of dimming LEDs is very effective and maintains the chromaticity coordinates (color temperature) of light from the LEDs. However there are several problems inherit with generating the dimming control voltage waveform ($f_{CTRL}$), as more fully described herein and shown in FIG. 2. The switching frequency ($f_{SW}$) may be from about 100 kilohertz to frequencies in the megahertz range, depending on the power converter type and topology used as current source. The duty ratio waveform frequency ($f_{DIMM}$) is typically between about 100 hertz to about four (4) kilohertz.

Figure 2:
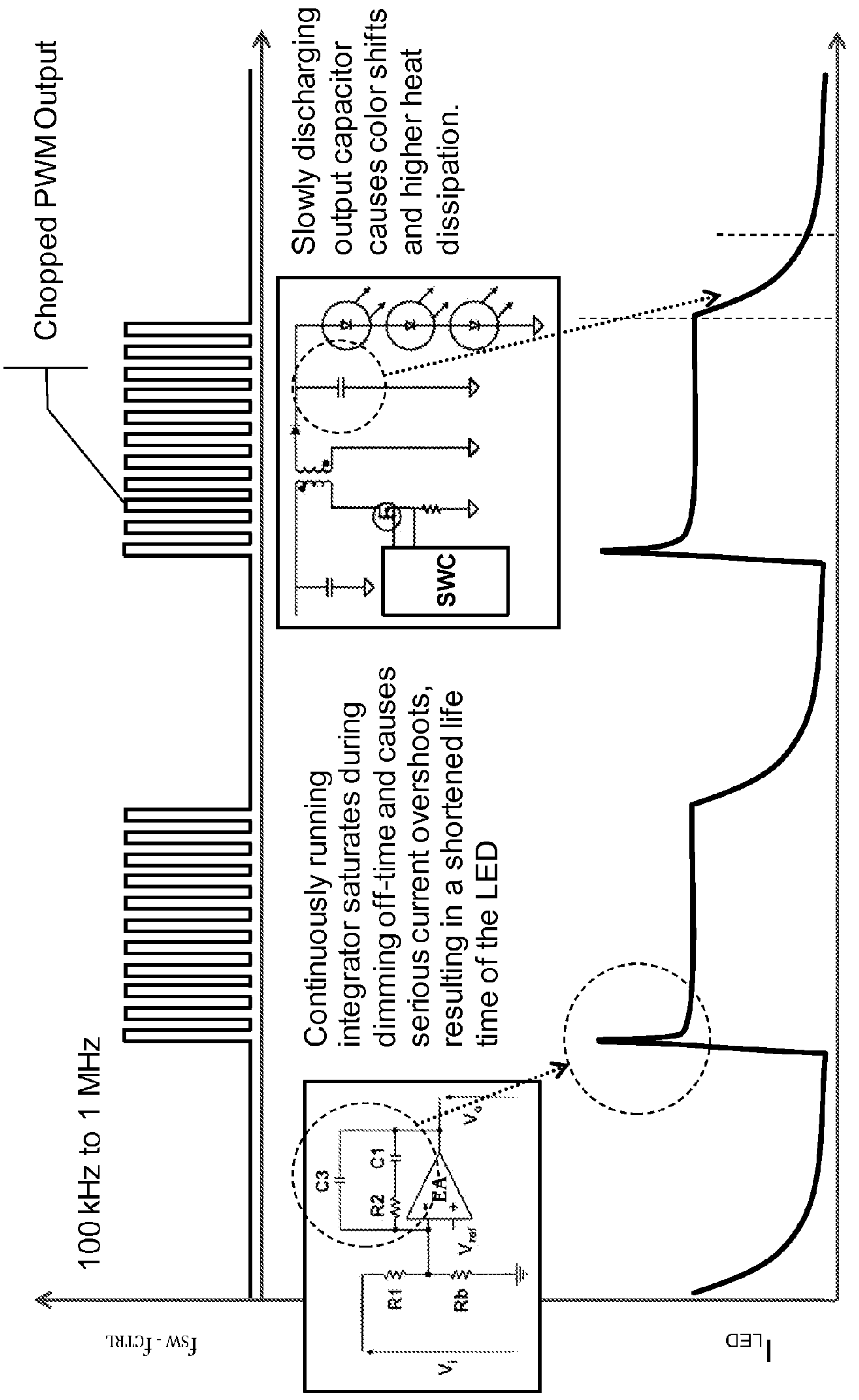
FIG. 2 illustrates a schematic graph of currents through the LEDs resulting from PWM dimming using the dimming current waveform shown in FIG. 1 with an inverting error amplifier having a continuous compensation network filter circuit in its feedback loop and a slowly discharging output capacitor.

Referring to FIG. 2, depicted is a schematic graph of currents through the LEDs resulting from PWM dimming using the dimming current waveform shown in FIG. 1 with an inverting error amplifier having a continuous compensation filter circuit in its feedback loop and a slowly discharging output capacitor. The continuously running compensation network saturates during dimming off-time and causes serious current overshoots when a voltage thereto is first applied. This current overshoot results in a shortened service life time of the LEDs. At the end of each modulated pulse train, the slowly discharging output capacitor causes shifts in color temperature and higher heat dissipation of the LEDs.

During off-time of the dimming control voltage waveform ($f_{CTRL}$), the feedback becomes zero and the inverting error amplifier (EA) increases its output to the maximum, adversely overcharging the compensation network in its feedback loop. When the PWM dimming control voltage waveform ($f_{CTRL}$) turns back, it takes the EA (e.g., compensation network) several switching cycles to recover while a large current peak is driven through the LEDs, that in the long term limits the service life time of the LEDs.

Figure 3A:
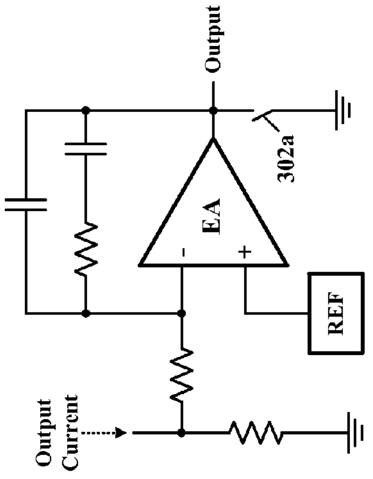
FIGS. 3A, 3B, 3C, 3D and 3E illustrate schematic diagrams of error amplifier "compensation network freeze" circuits, according to specific example embodiments of this disclosure.

Referring to FIGS. 3A, 3B, 3C, 3D and 3E, depicted are schematic diagrams of error amplifier "compensation network freeze" circuits, according to specific example embodiments of this disclosure. In an error amplifier (EA), during off-time the feedback becomes zero and the EA increases its output to the maximum thereby overcharging the compensation network. When the PWM voltage waveform is turned back on, it takes the LED dimming compensation network several switching cycles to recover while a large current peak is driven through the LEDs as shown in FIG. 2. General purpose operational amplifiers have the compensation network permanently connected to the feedback signal and EA output. Trans-conductance amplifiers have the compensation network connected to the EA output and ground (not shown). Possible solutions to current overshoot through the LEDs, according to the teachings of this disclosure may be as follows:

Shown in FIG. 3A, a switch 302*a* is coupled between the EA output and ground and resets the output thereof to substantially zero volts during the dimming PWM waveform off-time. This compensation network reset configuration results in the control loop starting up with a ramp voltage, and may be effectively used when no external load switch is available or parallel load switches are used. When slow current slew rates are uncritical this configuration may be effectively used for electromagnetic interference (EMI) optimizations.

Figure 3B:
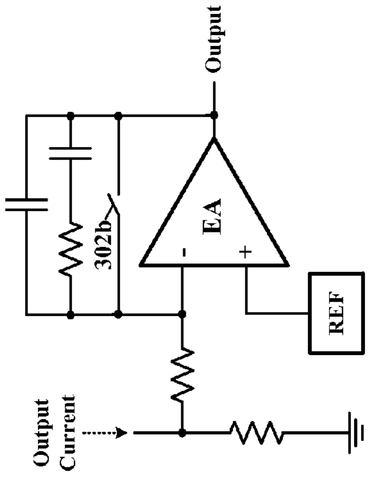

Shown in FIG. 3B, a switch 302*b* is coupled between the EA output and the inverting input of the EA. During the PWM waveform off time the output and the inverting input of the EA together are shorted together, effectively shorting the compensation network preventing saturation. When the feedback signal is substantially zero volts, the effects on the circuit might be similar to control scheme shown in FIG. 3A, however, might provide faster recovery when the PWM waveform is turned back on. During the off-time the EA has a unity gain of one (1). This unity gain configuration may be effectively used with external high-side or low-side load switches.

Figure 3C:
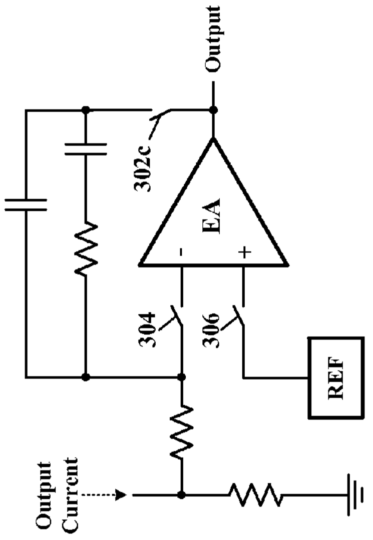

Shown in FIG. 3C, switch 302*c* is coupled between the EA output and the compensation network, switch 304 is coupled between the inverting input and the compensation network, and switch 306 is coupled between the non-inverting input and the voltage reference (REF). When the switches 302*c*, 304 and 306 are open, the feedback and output voltages of the EA are floating while the EA remains enabled. This configuration may be effectively used with external high-side or low-side load switches. It further represents the most effective conservation of the charge-level of the compensation network and fastest recovery period of the total error amplifier circuit.

Figure 3D:
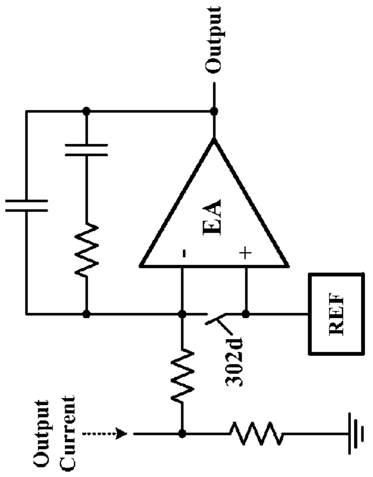

Shown in FIG. 3D, switch 302*d* is coupled between inverting and non-inverting inputs of the EA. Shorting the inverting and non-inverting inputs of the EA with the switch 302*d* sets the EA to a "non-error" mode that causes the compensation network to be balanced and the output of the EA will be driven to an "ideal" voltage level given by the reference voltage. As a result, the converter will step in at the beginning of the on-time with a minimum error (when properly synchronized with the external load switch). This configuration may be ideal to be used with external low-side load switches in particular. In this system level configuration, when the low-side load switch is open during the dimming off-time, the feedback signal will be pulled to ground by the low-side shunt resistor. The integrator resistor of the compensation network (connected in series with the shunt resistor) will further pull down the inverting input of the EA. As these resistors are usually in the kilohm range, the internal reference voltage will remain stable when connected to the inverting input line by switch 302*d*.

Figure 3E:
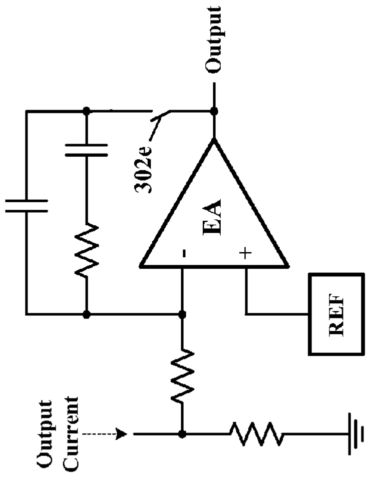

Shown in FIG. 3E, switch 302*e* is coupled between the EA output and the compensation network. Disconnecting the output of the EA from the compensation network with the switch 302*b* e.g., tri-state output, during the PWM waveform off time and then coupling back the compensation network to the EA output allows the compensation network to be pre-charged and thereby ramps up faster, e.g., resumes operation faster to the operating point of the power supply rather than the slower way of starting at ground potential. Although the EA will still increase its output voltage during the dimming off-time to its maximum, the disconnected compensation filter circuit will not saturate. As the bandwidth of the amplifier is at least one magnitude higher than the bandwidth of the compensation filter circuit, the transient injected while reconnecting will result in a "pre-charge during recovery" effect. When timed properly, the operational amplifier will regulate into nominal operation range before affecting the PWM generating circuit connected to the output of the amplifier. This configuration may be effectively used with external high-side or low-side load switches.

Figure 4:
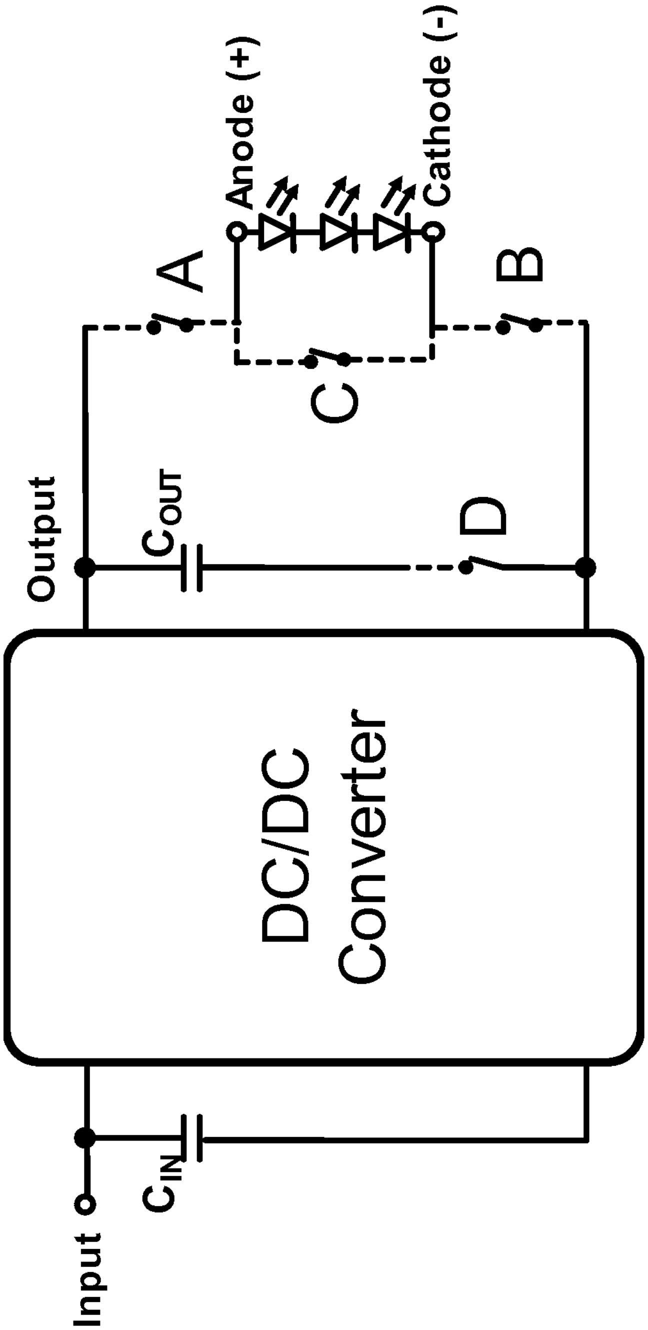
FIG. 4 illustrates a schematic block diagram of various load switch configurations for disconnecting the LEDs from the power source and/or shorting the output capacitor during the PWM dimming off-time, according to specific example embodiments of this disclosure.

Referring to FIG. 4, depicted is a schematic block diagram of various load switch configurations for disconnecting the LEDs from the power source and/or shorting the output capacitor during the PWM dimming off-time, according to specific example embodiments of this disclosure.

A serial high side switch located at "A" may be used in conjunction with high-side LED current monitoring. The load switch "A" (Serial High Side) is closed synchronously with PWM-restart and EA-release. EA-Modes that may be used are: "EA RESET" (FIG. 3A), "UNITY GAIN" (FIG. 3B), "EA DISCONNECT" (FIG. 3C) or "PRE-CHARGE RECOVERY" (FIG. 3E).

A serial low side switch located at "B" may be used in conjunction with low-side LED current monitoring. The load switch "B" (Serial Low Side) is closed prior to or synchronously with PWM-restart and prior to EA-release. EA-Modes that may be used are: "EA RESET" (FIG. 3A), "UNITY GAIN" (FIG. 3B), "EA DISCONNECT" (FIG. 3C), "EA INPUT SHORT" (FIG. 3D) or "PRE-CHARGE RECOVERY" (FIG. 3E).

A switch located at "C" (Parallel Short) connected in parallel with the LEDs may be used to short out the LEDs for no current flow therethrough. There should be a system total reset during the PWM waveform off-time. The load switch at "C" is opened prior to a synchronous PWM-restart and EA-release. EA-Modes that may be used are: "COMPENSATOR RESET" (FIG. 3A) or "PRE-CHARGE RECOVERY" (FIG. 3E).

A switch located at "D" (Output Voltage Freeze) in series with the output capacitor ($C_{OUT}$), coupled to either node of the output capacitor, may be used to interrupt voltage from the output capacitor to the LEDs, thereby preventing current flow therefrom. This configuration may be application for specific switch mode power supply (SMPS) topologies, e.g., SEPIC or fly-back. The load switch at "D" is closed prior to a synchronous PWM-restart and EA-release. EA-Modes that may be used are: "EA RESET" (FIG. 3A), "UNITY GAIN" (FIG. 3B), "EA DISCONNECT" (FIG. 3C) or "PRE-CHARGE RECOVERY" (FIG. 3E).

Figure 5:
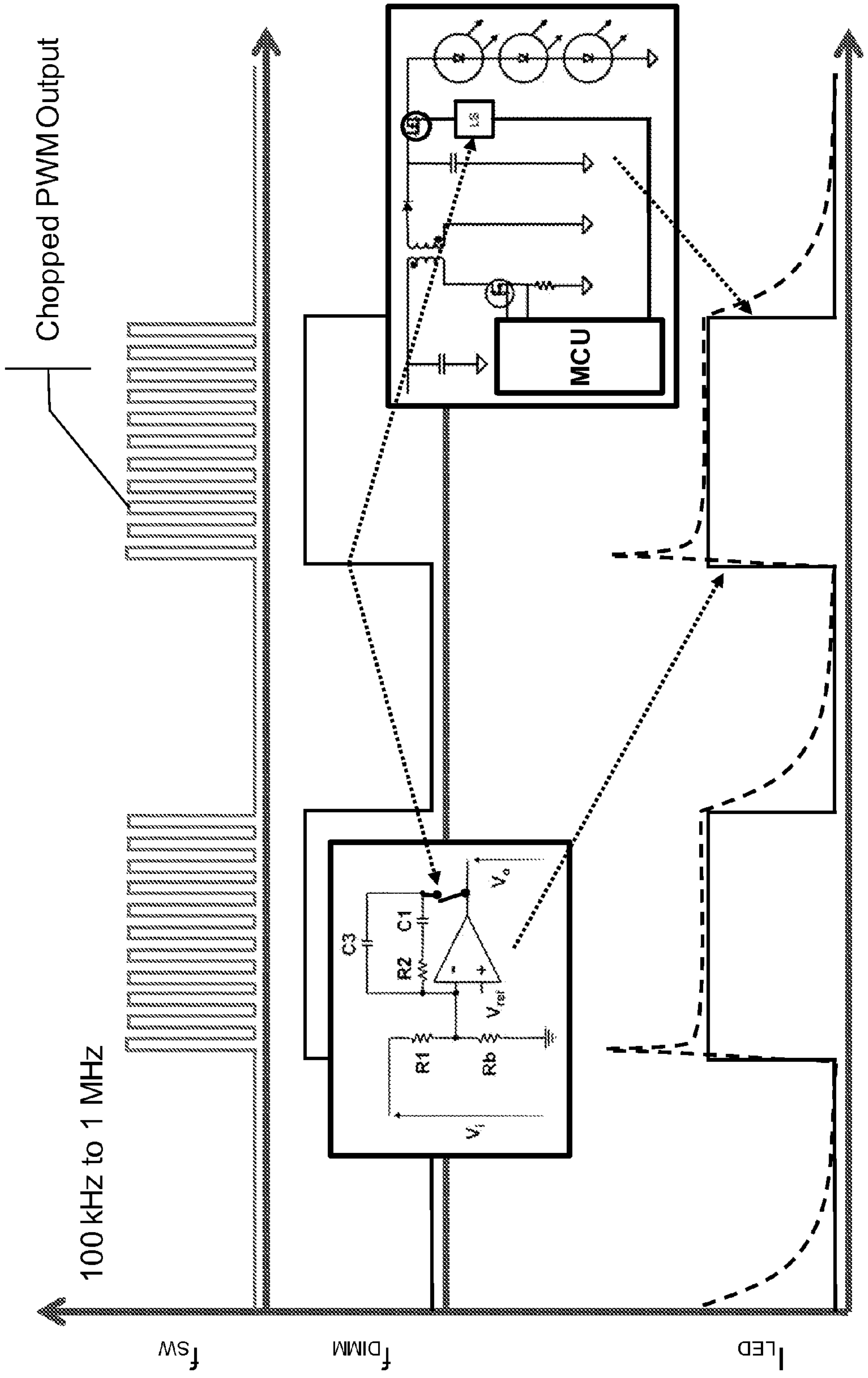
FIG. 5 illustrates schematic waveform and circuit diagrams of enhanced dimming circuits, according to specific example embodiments of this disclosure.

Referring to FIG. 5, depicted are schematic waveform and circuit diagrams of enhanced dimming circuits, according to specific example embodiments of this disclosure. As shown in FIG. 5, the current overshoot through the LEDs and residual tail currents are substantially eliminated by utilizing EA-Mode "PRE-CHARGE RECOVERY" (FIG. 3E) in conjunction with a load switch "A" (FIG. 4), according to the teachings of this disclosure.

Figure 6:
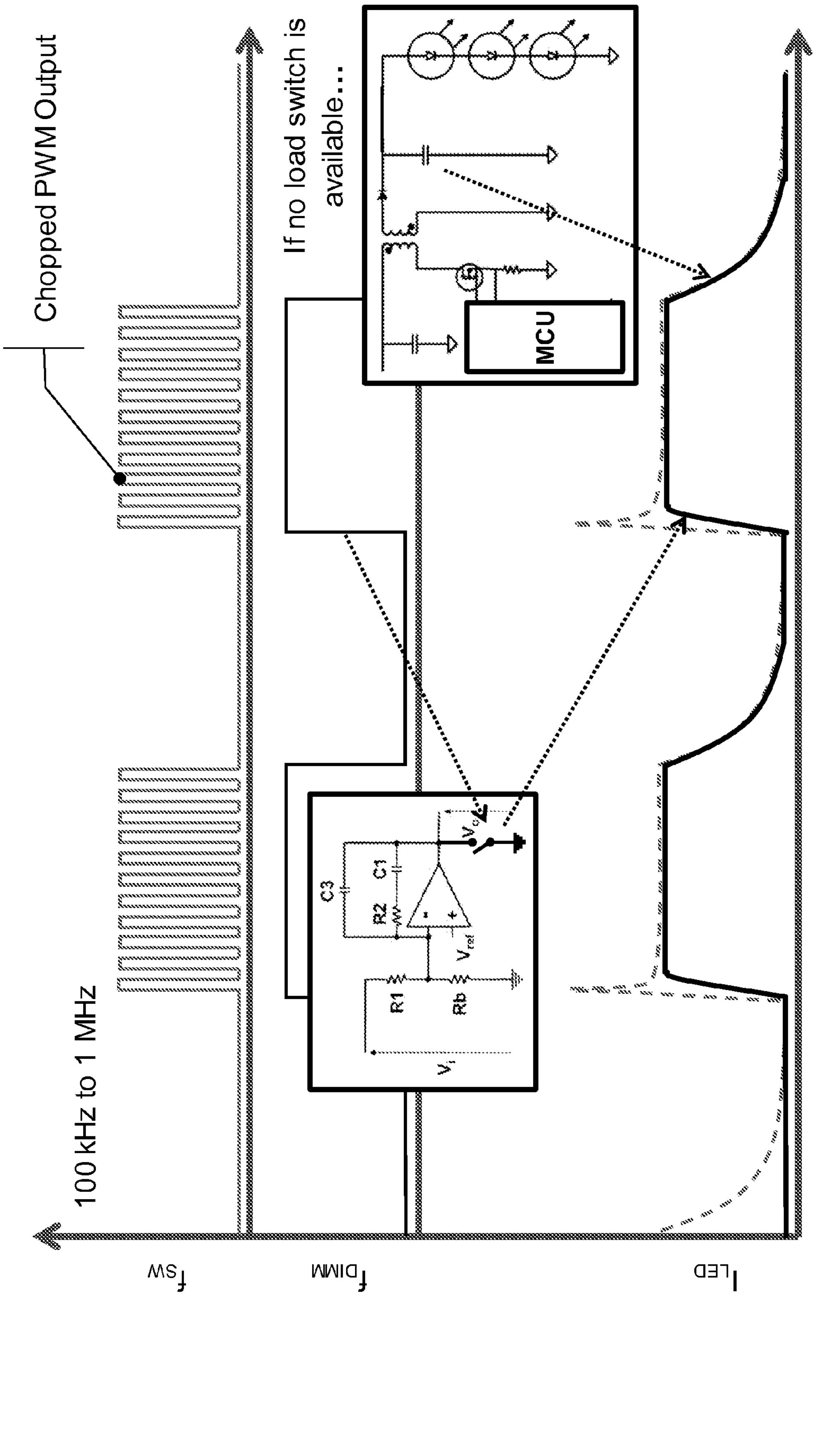
FIG. 6 illustrates schematic waveform and circuit diagrams of enhanced dimming circuits when no load switch is available, according to specific example embodiments of this disclosure.

Referring to FIG. 6, depicted are schematic waveform and circuit diagrams of enhanced dimming circuits when no load switch is available by utilizing EA-Mode "EA RESET" (FIG. 3A), according to specific example embodiments of this disclosure. As shown in FIG. 6, the current overshoot through the LEDs is eliminated by applying a start-up ramp, according to the teachings of this disclosure.

Figure 7:
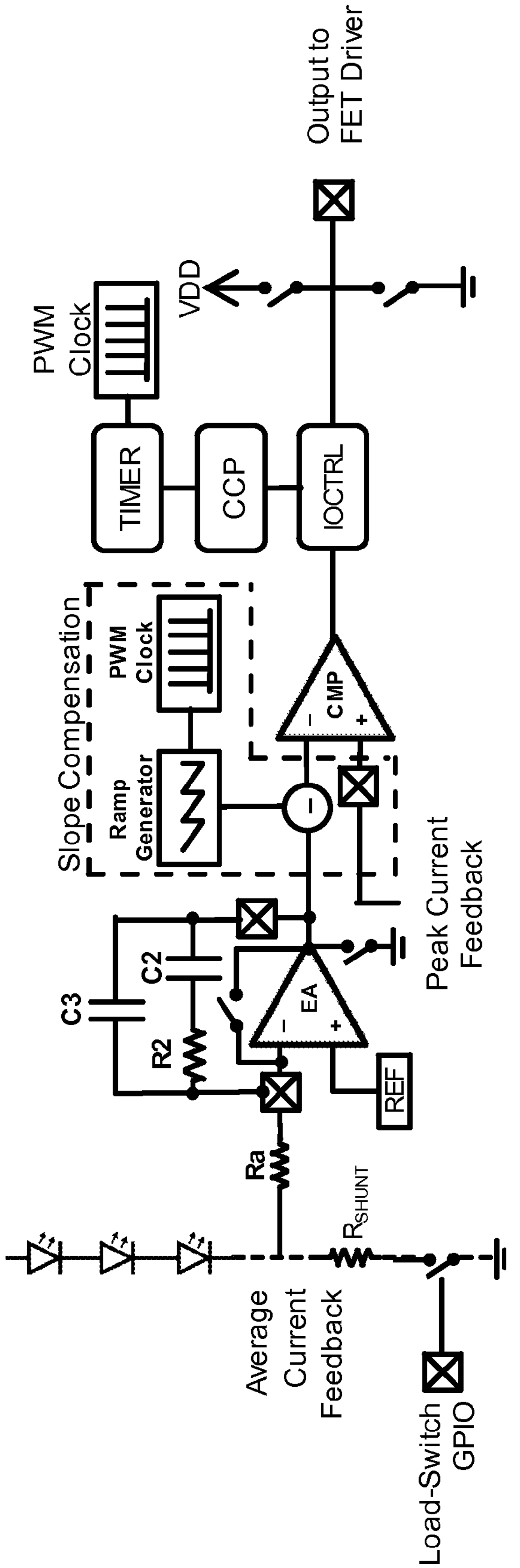
FIG. 7 illustrates a schematic block diagram of an external type II compensation network and a peak current mode control with internal slope compensation, according to an example embodiment of this disclosure.

Referring to FIG. 7, depicted is a schematic block diagram of an external type II compensation network and a peak current mode control with internal slope compensation, according to an example embodiment of this disclosure. Switches may be provided with the EA and compensation network as shown in FIGS. 3A-3E, and general purpose input-output (GPIO) switches may be provided to control a power field effect transistor(s) (FET) to turn on and off current through the LEDs as shown in FIG. 4, according to the teachings of this disclosure. In this controller architecture the conventional analog PWM generator, consisting of a saw-tooth generator, clock, analog comparator and SR latch, have been replaced by a digital PWM generator to enhance its controllability and synchronization capabilities. The integrated slope compensation further allows adjustments of the compensation ramp during runtime for enhanced operation and stabilized frequency domain characteristics of peak current mode controlled switched-mode power converters in applications with wide input voltage ranges, operating with fixed switching frequencies in continuous conduction mode at duty ratios greater than 40-50%.

It is contemplated and within the scope of this disclosure that some or all of the aforementioned circuit elements may be provided with a microcontroller, application specific integrated circuit (ASIC), programmable logic array (PLA) and the like.

Figure 8:
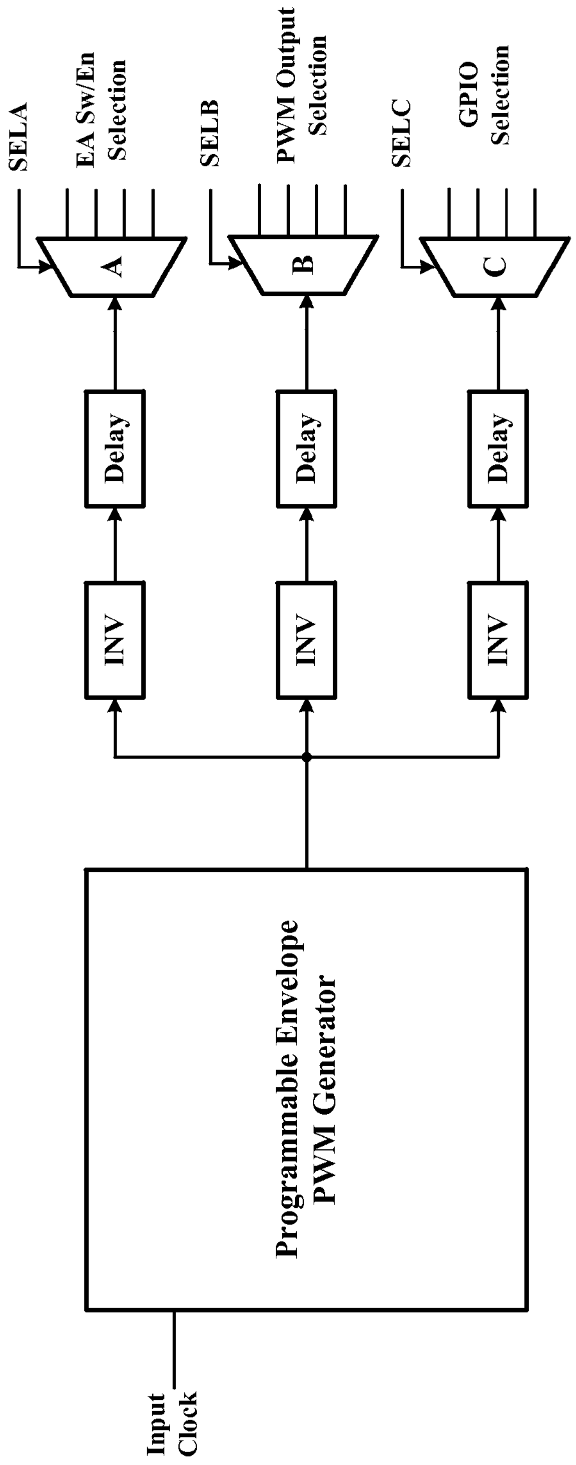
FIG. 8 illustrates a schematic block diagram of a dimming engine in combination with a programmable envelope PWM generator, according to the teachings of this disclosure.

Referring to FIG. 8, depicted is a schematic block diagram of a dimming engine in combination with a programmable envelope PWM generator, according to the teachings of this disclosure. Multiplexer A may be used to control the switch(es) that may disconnect/short the compensation network from the EA. Multiplexer B may be used to override the PWM output to the power switches of the SMPS topology while the power converter switching frequency PWM generator continues operation internally to the LED dimming controller. Multiplexer C may be used to control output drive to the LEDs, turn on and off external load-switches (FIG. 4), and disconnect or short the LEDs during off-time. The delay blocks may be adapted to adjust switch-sequencing timing requirements, according to the teachings of this disclosure. The inverting/non-inverting logic blocks may be used to adapt the control signals to application specific components, circuits, topologies and/or configurations.

Figure 9:
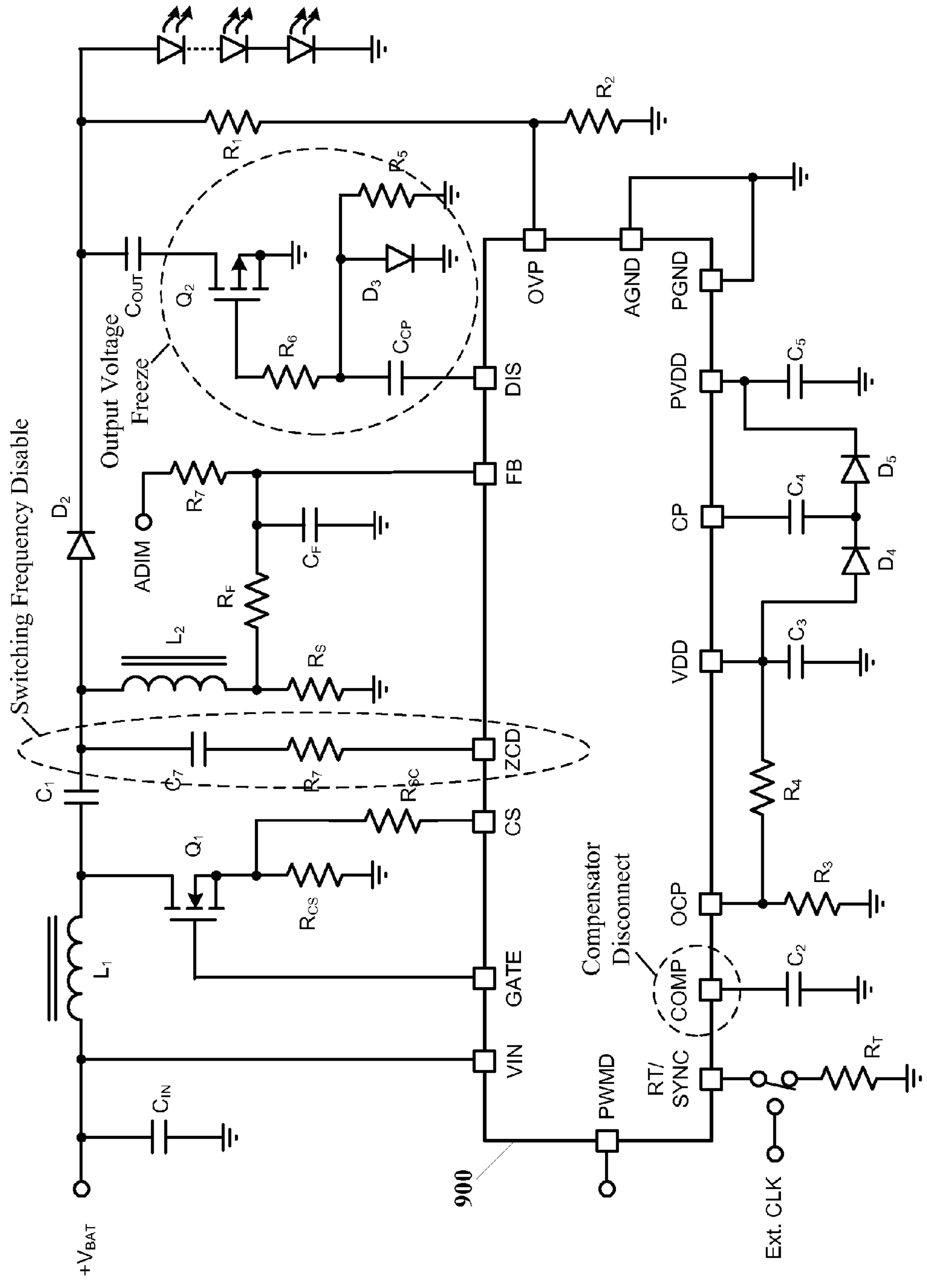
FIG. 9 illustrates a schematic diagram of an automotive LED driver circuit, according to a specific example embodiment of this disclosure.

Referring to FIG. 9, depicted is a schematic diagram of an automotive LED driver circuit, according to a specific example embodiment of this disclosure. This example shows a circuit for disconnecting the current source output capacitor from ground (configuration "D" in FIG. 4) in order to maintain its charge during the dimming off-time. To prevent further issues with the operation of the current source (e.g., single-ended primary-inductor converter SEPIC) external triggers might be used to synchronize the dimming engine to external processes (e.g., zero-cross detection of the current at the coupling point of the two inductors of the SEPIC topology) (not shown). The module 900 shown in FIG. 9 may be a LED dimming engine provided by an integrated circuit microcontroller, ASIC, PLA and the like.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A circuit arrangement for controlling a light emitting diode (LED) device, comprising:

a modulator operable to receive a pulse width modulation signal and a high frequency signal, and to generate a modulated high frequency signal; and a feedback circuit comprising an error amplifier and a compensation network, wherein the feedback circuit is synchronously switched from a first configuration to a second configuration during off times of the modulated high frequency signal, wherein:

the first configuration comprises the error amplifier and compensation network coupled together; and the second configuration comprises inverting and non-inverting inputs of the error amplifier shorted together.

2. The circuit arrangement according to claim 1, further comprising an external load switch coupled in series with the LED device and opening during the off times of the modulated high frequency signal.

3. The circuit arrangement according to claim 2, wherein the external load switch is coupled to an anode of the LED device.

4. The circuit arrangement according to claim 2, wherein the external load switch is coupled to a cathode of the LED device.

5. The circuit arrangement according to claim 1, further comprising an external load switch coupled in parallel with the LED device closed during the off times of the modulated high frequency signal.

6. The circuit arrangement according to claim 1, further comprising an external load switch coupled in series with an output capacitor, wherein the external load switch disconnects the output capacitor from the LED device during the off times of the modulated high frequency signal.

7. The circuit arrangement according to claim 1, wherein the high frequency signal is from about 100 kilohertz to several megahertz.

8. The circuit arrangement according to claim 1, wherein the pulse width modulation signal is from about 100 hertz to about four (4) kilohertz.

9. The circuit arrangement according to claim 1, wherein the first configuration comprises the error amplifier and compensation network coupled together, and the second configuration comprises an output of the error amplifier shorted to a common.

10. The circuit arrangement according to claim 1, wherein the first configuration comprises the error amplifier and compensation network coupled together, and the second configuration comprises an inverting input and output of the error amplifier shorted together.

11. The circuit arrangement according to claim 1, wherein the first configuration comprises the error amplifier and compensation network coupled together, and the second configuration comprises the compensation network decoupled from an output of the error amplifier, and inputs of the error amplifier decoupled from the compensation network and a voltage reference.

12. The circuit arrangement according to claim 1, wherein the first configuration comprises the error amplifier and compensation network coupled together, and the second configuration comprises the compensation network decoupled from an output of the error amplifier.

13. A method of controlling a light emitting diode (LED) device, said method comprising the steps of:

modulating a continuous high frequency signal with a lower frequency dimming signal having an on-off duty ratio to generate a control signal used in providing a desired lumen output from an LED device; and synchronously switching a feedback circuit comprising an error amplifier and a compensation network from a first configuration to a second configuration during off times of the modulated high frequency signal, wherein: the first configuration comprises the error amplifier and compensation network coupled together; and the second configuration comprises inverting and non-inverting inputs of the error amplifier shorted together.

14. The method according to claim 13, further comprising the step of disconnecting the LED device with a series connected load switch during the off times of the modulated high frequency signal.

15. The method according to claim 13, further comprising the step of shorting the LED device with a parallel connected load switch during the off times of the modulated high frequency signal.

16. The method according to claim 13, further comprising the step of disconnecting an output capacitor from the LED device during the off times of the modulated high frequency signal.

17. An integrated circuit light emitting diode (LED) controller having light dimming capabilities, comprising:

a first generator for providing a high frequency signal;

a second generator for providing a pulse width modulation signal;

a modulator operable to receive the pulse width modulation signal and the high frequency signal, and to generate a modulated high frequency signal;

a feedback circuit comprising an error amplifier and a compensation network, wherein the feedback circuit is synchronously switched from a first configuration to a second configuration during off times of the modulated high frequency signal, wherein:

the first configuration comprises the error amplifier and compensation network coupled together; and the second configuration comprises inverting and non-inverting inputs of the error amplifier shorted together; and a LED driver for coupling the modulated high frequency signal to an LED device.

18. The integrated circuit LED controller, according to claim 17, comprises a microcontroller.

19. The integrated circuit LED controller, according to claim 17, is selected from the group consisting of an application specific integrated circuit (ASIC) and a programmable logic array (PLA).

* * * * *